United States Patent
Chen et al.

(10) Patent No.: US 10,146,891 B2
(45) Date of Patent: Dec. 4, 2018

(54) EXTRACTING DATA FROM A 3D GEOMETRIC MODEL BY GEOMETRY ANALYSIS

(75) Inventors: Henry Chen, Beihing (CN); Conrad B. Beaulieu, Duluth, MN (US); Liana M. Kiff, Minneapolis, MN (US); Adam Gibson, Sunnybank (AU); Ben Coleman, North Ridge (AU)

(73) Assignee: Honeywell International Inc., Morris Plains, NJ (US)

( * ) Notice: Subject to any disclaimer, the term of this patent is extended or adjusted under 35 U.S.C. 154(b) by 499 days.

(21) Appl. No.: 13/436,334

(22) Filed: Mar. 30, 2012

(65) Prior Publication Data
US 2013/0257850 A1 Oct. 3, 2013

(51) Int. Cl.
*G06F 17/50* (2006.01)
*G06T 19/20* (2011.01)

(52) U.S. Cl.
CPC .......... *G06F 17/5004* (2013.01); *G06T 19/20* (2013.01); *G06T 2219/2012* (2013.01)

(58) Field of Classification Search
CPC ................. G06F 17/5004; G06T 19/20; G06T 2219/2012
See application file for complete search history.

(56) References Cited

U.S. PATENT DOCUMENTS

| | | | |
|---|---|---|---|
| 2006/0136179 A1* | 6/2006 | Sit ..................................... | 703/1 |
| 2006/0136791 A1 | 6/2006 | Nierle | |
| 2008/0238918 A1* | 10/2008 | Culver et al. ................. | 345/420 |
| 2008/0275674 A1* | 11/2008 | Reghetti et al. .................. | 703/1 |
| 2008/0281839 A1* | 11/2008 | Bevan et al. ................. | 707/100 |
| 2009/0307255 A1 | 12/2009 | Park | |
| 2010/0070241 A1* | 3/2010 | Opdahl et al. ..................... | 703/1 |
| 2010/0106674 A1* | 4/2010 | McLean et al. ................ | 706/52 |
| 2010/0223032 A1* | 9/2010 | Reghetti ................. | G06T 19/20 703/1 |
| 2010/0250615 A1* | 9/2010 | Reghetti ................. | G06F 17/50 707/802 |
| 2011/0016802 A1* | 1/2011 | Wallance ................ | E04B 1/003 52/79.9 |
| 2011/0057929 A1* | 3/2011 | Chen et al. .................... | 345/419 |

(Continued)

OTHER PUBLICATIONS

Ruiz, J.M. "BIM Software Evaluation Model for General Contractors," Masters Degree Thesis, University of Florida, 2009, 115 pages.*

(Continued)

*Primary Examiner* — Aniss Chad
(74) *Attorney, Agent, or Firm* — Brooks, Cameron & Huebsch, PLLC

(57) ABSTRACT

Systems, methods, and computer-readable and executable instructions are provided for extracting relationship data from building information model (BIM) data. Extracting relationship data from BIM data can include generating a three dimensional geometric model of a number of objects within the BIM data. Extracting relationship data from BIM data can also include determining a number of spatial relationships between a number of objects, wherein the spatial relationships are determined from the three dimensional geometric model. Furthermore, extracting relationship data from BIM data can include exporting the spatial relationships based on a number of criteria.

17 Claims, 4 Drawing Sheets

(56) References Cited

U.S. PATENT DOCUMENTS

2011/0093424 A1* 4/2011 Zimmermann et al. ........ 706/47
2011/0209081 A1   8/2011 Chen et al.
2011/0218777 A1   9/2011 Chen et al.
2013/0085588 A1   4/2013 Brun et al.

OTHER PUBLICATIONS

Cooper B Line "2005 Cable Tray Manual," Copyright 2005, Cooper B Line, Inc. Highland Illinois, 2005, 59 pages.*
Rick Hermans, P.E., "A Brief Introduction to Building Information Modeling (BIM)", Engineering System Solutions, Edition No. 30, Oct. 2008, (4 pgs.).
Dr. Marcus Keane, "BuildWise Project", Enterprise Ireland, Accessed: Mar. 30, 2012, Retrieved from: http://csserver.ucd.ie/~aruzzelli/weeb-projects/buildwise.pdf, (15 pgs.).
C.F. Moller, "BIM: Building Information Model", Accessed: Mar. 30, 2012, Retrieved from: http://www.cfmoller.com/log/attachments_CFM/12/BIM%20folder%20Book%202.pdf, (20 pgs.).
Artur Krukowski, et al. Comprehensive Building Information Management System Approach. International Journal of Simulation Systems, Science & Technology, vol. 11, No. 3, pp. 12-28, May 2010.
Andreas Fernbach, et al. Interoperability at the Management Level of Building Automation Systems: A Case Study for BACnet and OPC UA, IEEE ETFA. pp. 1-8. 2011.

\* cited by examiner

EXTRACTING DATA FROM A 3D GEOMETRIC MODEL BY GEOMETRY ANALYSIS

TECHNICAL FIELD

The present disclosure relates to extracting building information model (BIM) data from a three dimensional (3D) geometric model.

BACKGROUND

Building information modeling (BIM) can refer to the generation and/or management of data associated with a building (e.g., data associated with the components, equipment, and/or properties of the building). For example, BIM data can include architectural, mechanical, electrical, plumbing, sanitary, fire, and/or geometrical information associated with a building.

The leading international standard for describing the data contained within a building information model is called the Industry Foundation Classes (IFC), which is an open standard designed and maintained by the Building Smart Alliance. This is a very comprehensive standard that provides for the description of data related to many sub-domains related to the design, build, construction, and/or operation of a building environment. Furthermore, within each sub-domain, the data can be very detailed and complex in representation.

The amount of BIM data associated with a building, and codified or expressed in the IFC standard, tends to be proportional to the size of the building, and can grow exponentially based on the number of specific sub-domains that are identified and documented in the BIM, including, for example, plumbing, electrical, or mechanical systems. Therefore, even a small building with very complete information for many different systems within the building may have a very large amount of BIM data associated therewith. Accordingly, a BIM model of any building may include a large amount of BIM data, which can increase the amount of time and/or computing resources needed to display the BIM model, or identify the relevant objects and/or relationships in the building, and thus have a negative impact on the application, particularly when the user only desires a particular portion of the BIM data.

The commercially available tools and standards for developing BIM data can be inconsistent. In addition, the application of the tools and a number of modeling techniques can also be inconsistent. Thus, additional methods to determine useful information from the geometry of the number of modeling techniques can be beneficial.

DETAILED DESCRIPTION

Figure 1:
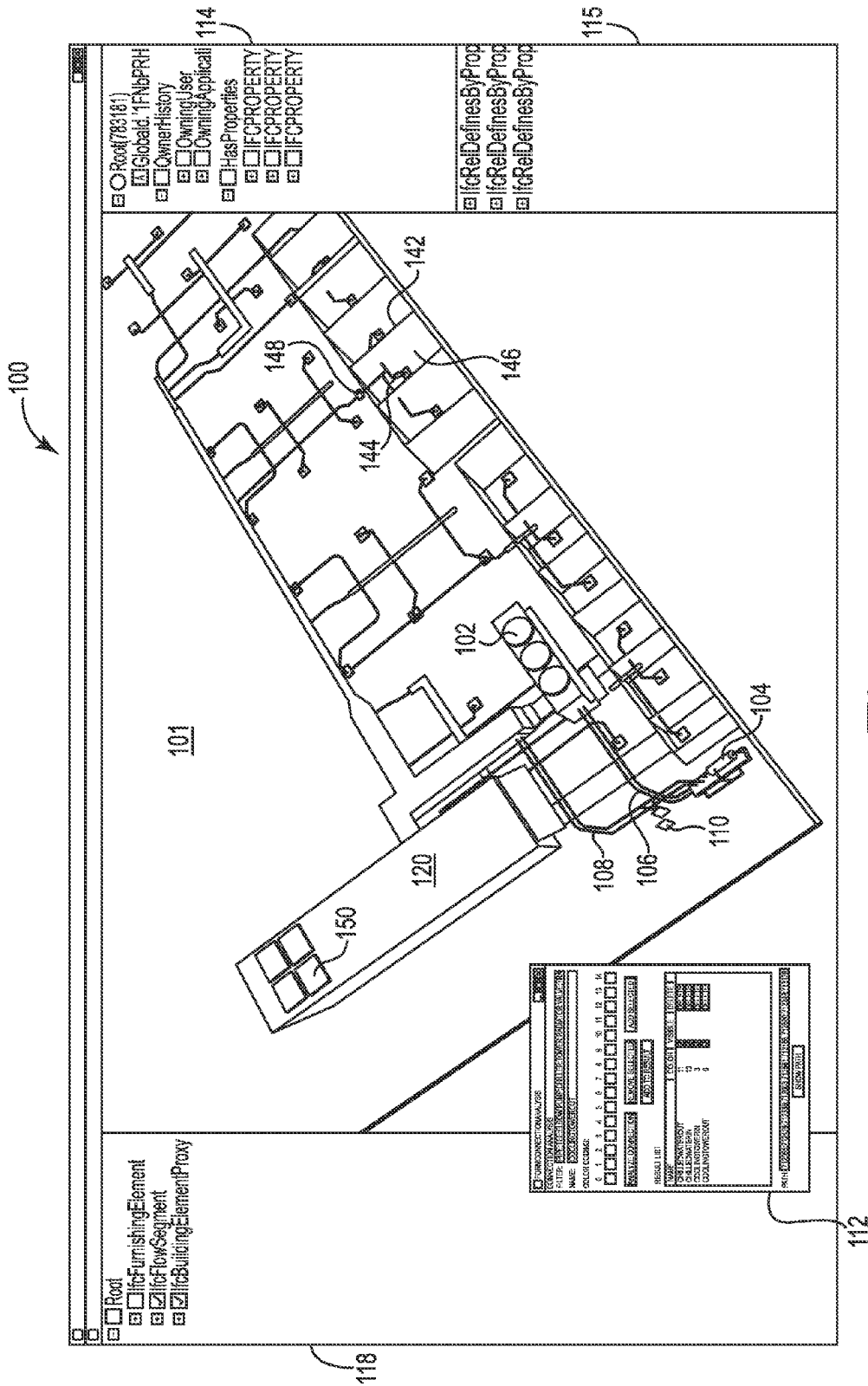
FIG. 1 illustrates a display view of a virtual 3D display visualization of a building in accordance with one or more embodiments of the present disclosure.

Devices, methods, and systems for extracting relationship data from a 3D geometric model of building information model (BIM) data are described herein. For example, one or more embodiments can include generating a three dimensional geometric model of a number of objects within the BIM data. One or more embodiments can also include determining a number of spatial relationships between a number of objects, wherein the spatial relationships are determined from the three dimensional geometric model. One or more embodiments can also include exporting the spatial relationships based on a number of criteria. One or more embodiments can also include creating a virtual 3D display visualization of the number of objects based on the three dimensional geometric model. Furthermore, one or more embodiments can include providing an object selection function for the virtual 3D display visualization of the building to allow selection of a single object from the number of objects by exporting data of the single object from data utilized to create the virtual 3D display visualization.

A selection operation can include a human user and a selection method that may include a virtual 3D visualization, or it may include a system, using an application interface to request specific subsets of data and relationships from the spatial model without utilizing a visualization. A subset of data can include a number of objects selected based on a number of spatial relationships. For example, if a HVAC system were selected, the subset of data could be the HVAC system.

In some instances, information that is desired is not directly represented within the 3D geometric model, but must be interpreted or determined from that model based on spatial analytics. Determining can include analyzing a number of spatial relationships within the 3D geometric model to produce the desired information in a computer-readable and transferrable format for further processing.

It can be evident to a human user looking at the virtual 3D visualization of a building, that one object is related to another by its location in space. For example, it may be evident that an air diffuser, which is meant to deliver air to a space, is delivering air to a particular space with identity in the model. It may not be the case, however, that the model actually embodies this relationship in any direct fashion (e.g., the model may not have an element of data contained therein explicitly identifying that the diffuser supplies treated air to the space). While a human user can visualize these relationships, a computing device may have to determine the spatial relationships within the 3D geometric model.

Furthermore, the system or human user may desire that the relationship data be transposed into a different data structure from the original 3D geometric model. This may include a different standard model, a simple tree-like data model of related elements, or a database structure representing the subset of objects and connections, with no actual spatial data remaining (e.g., no geospatial reference). The relationship data extracted from the model in this fashion may be represented in any fashion (e.g., a fashion that preserves the data of interest for the end user or system).

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 112 may reference element "12" in FIG. 1, and a similar element may be referenced as 212 in FIG. 2.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of objects" can refer to one or more objects.

FIG. 1 illustrates a user interface 100 of a virtual 3D display visualization 101 of a building in accordance with one or more embodiments of the present disclosure. The user interface 100 can be shown on a display (e.g., monitor, etc.) of a computing device (e.g., computer, tablet, or personal digital assistant (PDA), etc.). The user interface 100 can be performed within a software operating system (e.g., Windows 7®, Linux®, OS X®, among others).

The user interface 100 can present a virtual 3D display visualization 101 of a building based on a 3D geometric model of the BIM data. The virtual 3D display visualization can enable a user to navigate the information of the 3D geometric model. For example, the 3D geometric model can be produced from the BIM data to provide a number of spatial relationships. These spatial relationships can be utilized to generate the virtual 3D display visualization 101 and exported to the user interface 100. The virtual 3D display can enable a user to navigate the spatial information generated by the 3D geometric model.

The user interface 100 can present a virtual 3D display visualization 101 including various objects and/or selected equipment (e.g., heating, ventilation, air conditioning (HVAC), plumbing, electrical, structural, etc.) throughout the building. The desired equipment can be selected based on a set of criteria (e.g., single object, system, room, floor, etc.). The user interface 100 can have multiple sections 114, 115, 118 for displaying a number of names of the equipment displayed on the user interface 100. For example, section 114, 115, 118 can be utilized to display a folder location for the BIM data.

Section 114, 115, 118 can also be split into a number of sections in order to further display names for a number of various equipment. The names can be selected and deselected from the section 114, 115, 118. Selected items from the section 114, 115, 118 can be displayed on the virtual 3D display visualization of the building. Deselected items from the section 114, 115, 118 can be removed from the virtual 3D display visualization 101. For example, if the name cooling tower 102 was in a list of items in section 118, the name could be selected in order to show the cooling tower 102 in the virtual 3D display visualization 101. In another example, if the name liquid chiller 104 was deselected it could be deselected in order to remove the liquid chiller 104 from the virtual 3D display visualization 101.

The user interface 100 currently shows an example HVAC system in the virtual 3D display visualization 101 for the building. The example HVAC system can comprise various objects and/or equipment (e.g., roof top unit (RTU) 120 with vents 150, cooling tower 102, liquid chiller 104, pipes (water in 106 and water out 108), air ducts 103, diffusers 144, valves 110, variable air volume (VAV) box 148, etc.).

The virtual 3D display visualization 101 can be converted to various formats (e.g., 2-dimensional, 1-dimensional, etc.). The virtual 3D display visualization 101 can be re-positioned to accommodate various views (e.g., side view, top view, bottom view, etc.). The user interface 100 can allow the selection of various objects from any of the various formats and/or various views.

The objects and/or equipment that are displayed in the virtual 3D display visualization 101 can be listed in the sections 114, 115, 118. The sections can display the number of objects and/or equipment to give a textual list of what is displayed in the virtual 3D display visualization 101. Sections 114, 115, 118 can list the information in a variety of ways (e.g., location within the BIM data, common object name, designated object name, part number, etc.). For example, section 118 can list objects and/or equipment by a spatial relationship description (e.g., ifcFlowSegment, IfcBuildingElementProxy, etc.).

The BIM data can have extensive relationship data (e.g., properties of the object, location of the object, etc.) regarding various objects within the building. The relationship data within the BIM data can be utilized to determine the spatial relationship of the various objects of the HVAC system. For example, within the BIM data, it can be shown that the diffuser 144 can have a relationship with the VAV box 148. In this example, the relationship can be through the ductwork that connects the diffuser 144 and the VAV box 148. In another example, the diffuser 144 can have a relationship with space 146. Furthermore, it can be shown that the diffuser can have a relationship with a room 142.

The various relationship data (e.g., physical, spatial, relationship, location, etc.) between the various objects of the HVAC system in the BIM data can be used to determine one or more spatial relationships between a number of objects. For example, the relationship data within the BIM data can be utilized to determine information regarding various relationships of the diffuser 144. The various relationships of the diffuser 144 can be used to determine the spatial relationships of the diffuser 144.

The spatial relationships of the diffuser 144, for example, can also include combinations of various equipment data (e.g., cost, fire rating, ordering information, inventory, etc.) specific to the make and model of the diffuser from the BIM data. For example, the spatial relationships for the diffuser 144 can include various properties (e.g., size, material, shape, location, weight, safety rating, cost, etc.) of the diffuser 144 and how the various properties of the diffuser 144 interact with the various objects and spaces surrounding the diffuser 144. For example, the diffuser 144 may have properties for installation that require a particular material (e.g., drywall, metal, wood, etc.) surrounding the diffuser 144 for proper installation.

The various objects and spaces 146 surrounding the diffuser 144 in the room 142 can also comprise various properties. The various properties of the diffuser 144 and the various properties of the objects and spaces 146 surrounding the diffuser 144 can also determine the spatial relationship of the diffuser 144. For example, the properties and the location of the diffuser 144 can have a spatial relationship with the air ducts connecting the diffuser 144 and the VAV box 148. In another example, the properties and the location of the diffuser 144 can have a spatial relationship in relation to lights in the room 142.

The various spatial relationship data that is determined can be written into the BIM data. For example, the spatial relationship data can be determined for a number of objects based on the BIM data. The determined spatial relationship data can be written into the BIM data for exporting directly from the BIM data and can be consistent with existing IFC-based standards of BIM representation.

The user interface 100 can provide an object selection function for the selection of an object (e.g., piece of equipment, a system, a portion of a system, etc.). With selection of the object, the user interface 100 can export spatial relationship data (e.g., data from the BIM data relating to the object, relationship data, spatial relationship data, among other data) for the selected object. Objects can be selected in a variety of ways and based on a set of criteria (e.g., single object, system, room, floor, etc.). For example, a room 142 could be selected. If the room 142 was selected, and based on the desired relationship (e.g., touch, containment, overlap, disjoint, etc.), a number of objects from the room 142 could be selected. For example, if the room 142 was selected and based on a desired relationship of "containment", all of the objects in a "containment" relationship of the room 142 would be selected. The desired relationships are described in further detail herein.

A visualization can be an aid to enable a human user to participate in the object relationship selection process. Similarly, it can be possible to provide an entirely digital computer interface to allow a system to directly interrogate or select objects and relationships of interest in the model without human intervention or rendering of a visual representation of the model.

The spatial relationship data for the selected object can be exported to a number of locations (e.g., new window, fault detection application, diagnosis applications, etc.). The exported spatial relationship data can be useful in a variety of ways (e.g., viewing of a single object, viewing of a single system, changing an object, changing object(s) within a system, diagnosing problems with an object, diagnosing problems within a system, etc.) For example, if the diffuser 144 were selected the spatial relationship data and other data relating to the diffuser 144 could be exported to a desired location (e.g., new window, fault detection application, diagnosis application, etc.).

The exported spatial relationship data can be managed in a variety of ways (e.g., altered, viewed at various angles, updated, re-color coded, etc.). The exported spatial relationship data can be altered (e.g., moved, changed, removed, replaced, updated, etc.). The spatial relationship data that is altered can be uploaded into the BIM data and a new determination of spatial relationships can be conducted based on the altered BIM data. For example, if the diffuser 144 was selected and altered to be removed, the BIM data would be updated to report that the diffuser 144 was removed. If the BIM data was updated to report that the diffuser 144 was removed, the spatial relationships of the objects and spaces surrounding the removed diffuser 144 would change and the 3D geometric model of the building would be updated to include the new spatial relationships without the diffuser 144. The updated 3D geometric model that includes the new spatial relationships can be written to the BIM data.

Updating and/or writing the spatial relationships and the 3D geometric model into the BIM data can be advantageous for a number of reasons. For example, if a group is working on the HVAC system and changes the diffuser 144 location, then the updated 3D geometric model can alert other groups working on other equipment related to the building that the plan for the diffuser 144 has been altered. This example could eliminate confusion between various groups working on the same building, among other advantages.

Figure 2:
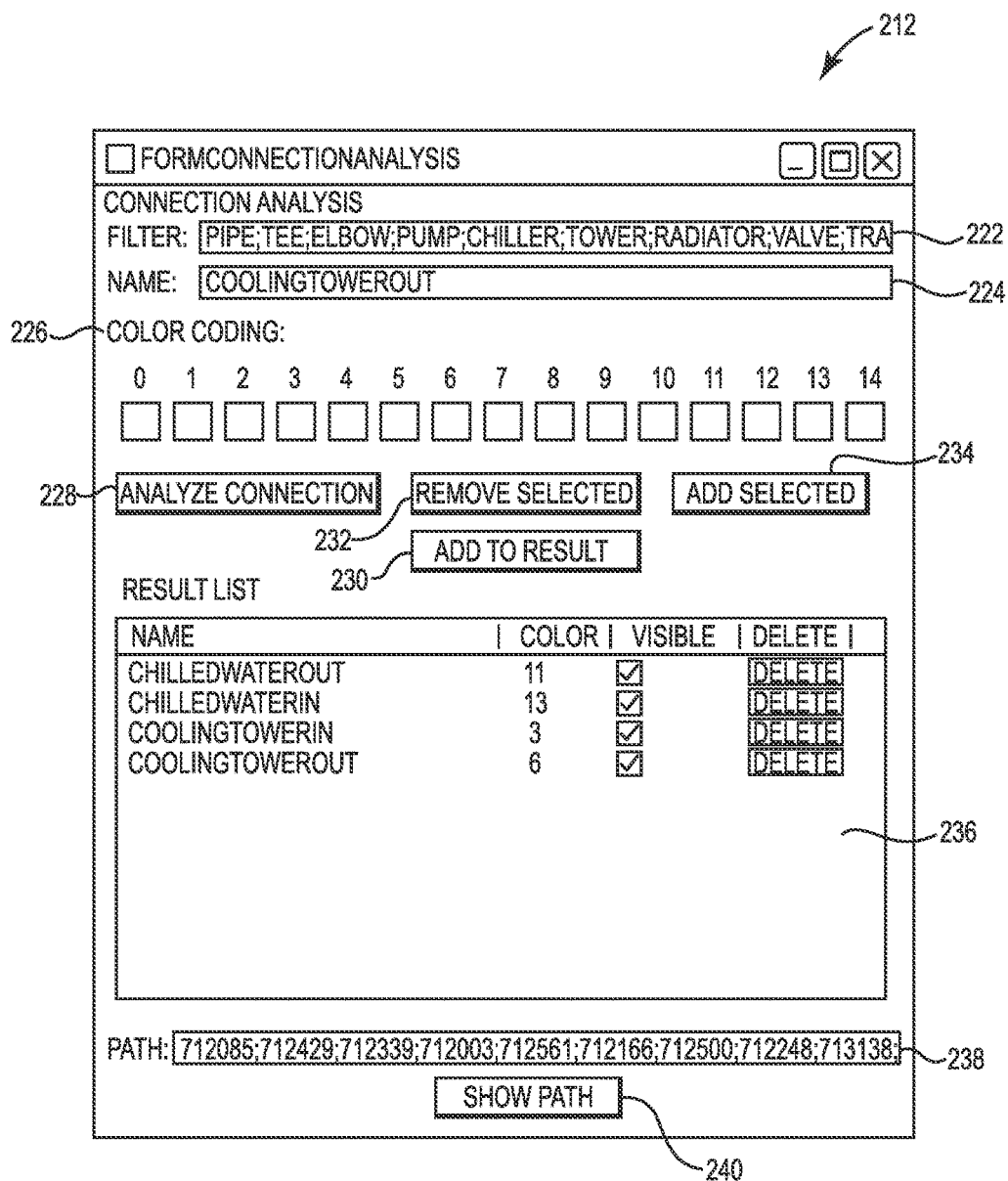
FIG. 2 illustrates a display view of a relationship analysis user interface in accordance with one or more embodiments of the present disclosure.

FIG. 2 illustrates a relationship analysis user interface 212 in accordance with one or more embodiments of the present disclosure. The relationship analysis user interface 212 can be shown on a display (e.g., monitor, etc.) of a computing device (e.g., computer, tablet, PDA, etc.). The relationship analysis user interface 212 can be performed within a software operating system (e.g., Windows 7®, Linnux®, OS X®, among others).

The relationship analysis user interface 212 can include a filter input 222. The filter input 222 can provide selectable terms (e.g., objects, systems, spaces, rooms, etc.) to filter the number of objects that are prepared to export. For example, a number of objects can be listed in the filter input 222 and the relationship analysis user interface can determine a number of results and display the number of results at 236. The determination by the relationship analysis user interface 212 can be determined for various types of predetermined relationship categories (e.g., "touch", "within", "overlap", "disjoint", among others). The relationship categories can comprise various sets of criteria that can filter the BIM data in order to provide a desired number of objects (e.g., a particular system, a particular room, a particular piece of equipment, etc.).

The number of results 236 can include the number of objects selected and also include objects that are determined to have the type of relationships selected. For example, if "within" was selected as the type of relationship and the term RTU was provided in the filter input 222, then the relationship analysis could determine all of the 3D geometric model data for the RTU and the objects within (e.g., inside, comprising, inside a pre-determined boundary of the object, etc.) the RTU.

The number of results 236 can include the number of objects selected and the number of objects determined to be in a "touch" relationship. The "touch" relationship can include objects physically touching the selected object. For example, if the diffuser was selected then it could be determined that the air ducts that connect the diffuser to the VAV box would "touch" the diffuser. It could also be determined that the VAV box would "touch" the diffuser if it was determined that there was a physical relationship between the diffuser and the VAV box and/or if the VAV box and the diffuser had a common set of physical relationships.

A common set of physical relationships can be two objects connected by a common object and/or set of objects. For example, the two objects could be the VAV box and the diffuser and the common set of physical relationships could be the air ducts that connect the VAV box and the diffuser.

The number of results 236 can include the number of objects selected and a number of objects determined to be in an "overlap" relationship. The "overlap" relationship can include objects that are relatively near the selected object (e.g., same room, within 1 foot, within 1 inch, etc.). The "overlap" relationship can also include all of the objects within a particular viewing window. For example, if a user is viewing an object and an area around the object, the "overlap" relationship could be all objects that would be in the viewing window of the user.

The number of results 236 can also include the number of objects selected and a number of objects determined to be in a "disjoint" relationship. The "disjoint" relationship can be objects that are mutually exclusive and bear no relation. It could be desired to view "disjoint" objects when planning to implement new objects into a building. For example, many objects in having a "disjoint" relationship could be problematic for implementing a new piece of equipment into an existing building plan and/or structure.

The number of results 236 can be color coded according to a color coding system 226. The color coding system 226 can be used to categorize various objects into variety of customizable categories (e.g., systems, similar objects, plumbing, electrical, HVAC, etc.). The color coding system 226 for the variety of categories can enable a user to distinguish from the various categories within the 3D geometric model of the building. Each color can, for example, be assigned a number. The number that is assigned to the color can be included in a Number heading 237-2 in the number of results 236. The user can then use the number from the Number heading 237-2 and refer to the color coding 226 to determine what color the corresponding object is within the 3D geometric model.

The number of results 236 can have any number of headings (e.g., 237-1, 237-2, . . . , 237-N). For example, the relationship analysis user interface 212 currently shows four headings 237-1, 237-2, 237-3, 237-4. The headings can have various categories (e.g., Name, Color, Visible, Delete) to described and/or allow the user to modify the number of results 236. For example, the Name heading 237-1 can allow a user to view a descriptive name of an object. In another example, the Visible heading 237-3 can allow a user to select and/or deselect an object to be viewed in the 3D geometric model. Furthermore, an example can include a Delete heading 237-4 that can allow a user to delete an object from the number of results 236 and/or from the virtual 3D display visualization.

The relationship analysis user interface 212 can allow a selected object from the number of results 236 to be added to the virtual 3D display visualization. For example, if the diffuser was selected from the number of results, the diffuser could be added to the virtual 3D display visualization by selecting the diffuser from the number of results and selecting an add selected option 234.

The relationship analysis user interface 212 can also allow a selected object from the number of results to be removed from the virtual 3D display visualization and from the number of results. For example, there can multiple objects within a virtual 3D display visualization including a diffuser and a RTU. If the RTU is selected from the number of results 236 and the remove selected option 232 is selected, the RTU can be removed from the virtual 3D display visualization and from the number of results.

The relationship analysis user interface 212 can further analyze various relationships if the analyze relationship option 228 is selected. The analyze relationship option 228 can determine various types of relationships between objects and produce a number of results 236. For example, an object can be selected from the number of results 236 and/or the virtual 3D display visualization. The analyze relationship option 228 can determine all and/or some of the relationships (e.g., "touch", "within", "overlap", "disjoint", among others) for the selected object. The relationships that are determined for the selected object can be added to the number of results 236 and/or to the virtual 3D display visualization.

The relationship analysis user interface 212 can also include a path of the relationships. The path of the relationships can include a list of objects 238. The list of objects 238 can be organized in various ways. For example, the list of objects 238 can be organized so objects that are connected are next to each other. For example, if a diffuser and the air duct that connects to the diffuser were within the list of objects 238, the diffuser and the air duct could be listed: diffuser; air duct. The list of objects can be represented in various ways (e.g., names, numbers, serial numbers, etc.). To avoid confusion, each object can be assigned a different number and the list of objects can include a list of numbers that represent each object.

The list of objects 238 can be selected and shown in the virtual 3D display visualization by selecting the show/path option 240. The show/path option 240 can display the selected list of objects 238 in the virtual 3D display visualization.

Figure 3:
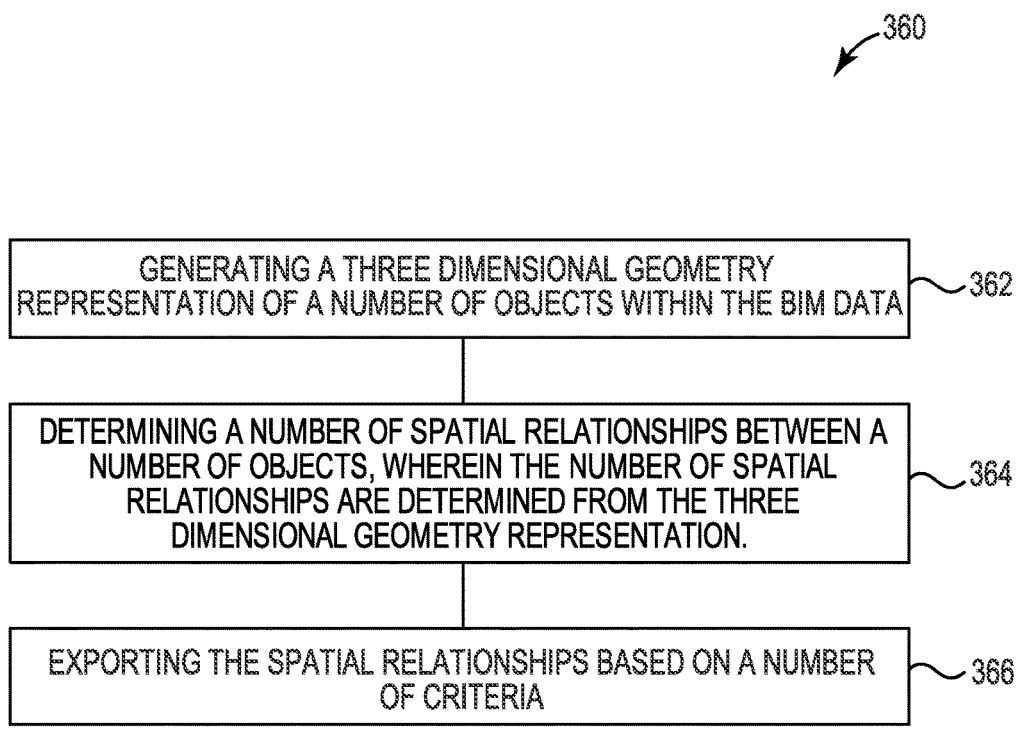
FIG. 3 illustrates a method for extracting relationship data from a 3D geometric model of a building in accordance with one or more embodiments of the present disclosure.

FIG. 3 illustrates a method 360 for extracting relationship data from a 3D geometric model of a building in accordance with one or more embodiments of the present disclosure. The 3D geometric model of a building can include a three dimensional representation of a number of objects (e.g., equipment, walls, systems, etc.) and optionally presented by a user interface and displayed on a monitor of a computing device (i.e., virtual 3D display visualization 101).

At 362, the 3D geometric model of a number objects within the BIM data is generated. As described herein, a number of objects and/or equipment from the BIM data can be analyzed to determine a number of spatial relationships of the number of objects and/or equipment.

A number of objects within the BIM data can be selected from the generated 3D geometric model based on a number of relationships, wherein the number of relationships are derived through spatial analysis of the geometry. For example, the number of objects can be selected based on a number of criteria (e.g., single object, system, room, floor, etc.). In another example, the number of objects can be selected based a number of relationships (e.g., touch, within, overlap, disjoint, etc.). Furthermore, in an example, a number of objects and/or areas can be selected and a number of relationships and/or criteria can be selected to determine the number of relationships of the number of selected objects. For example, if a diffuser was selected and a relationship of "touch" was further selected, it could be determined that all objects in a "touch" relationship with the diffuser could be exported.

The spatial relationships within the 3D geometric model can include a "containment" relationship, where a specific object is contained within the geometric confines of another defined object (or space). The spatial relationships can also include a "touch" relationship, which describes physical proximity, rather than containment. Furthermore, a number of abstract relationships can be identified between a number of objects in the 3D geometric model based on a number of intervening devices or objects in the BIM that can interfere with the direct relationship of those objects.

For example, a diffuser located in a first room can receive treated air from VAV which is located in a second room, and can receive conditioned air from an air handler unit that is located on the roof of a building. The diffuser, the VAV, and the air handler unit may not directly be in a "touch" and/or a "containment" relationship within the 3D geometric model. However, utilizing a spatial analysis and/or by following the relationships between "touch" relationships and "containment" relationships of specific pieces of equipment in the model the diffuser, the VAV, and the air handler unit can be in a relationship. From the perspective of the ductwork and equipment that allow air to be treated and distributed in a building, the diffuser is in a "downstream" relationship with respect to the air handler and the VAV. The air handler is upstream of the VAV in the context of the movement of air through the ductwork that connects them. A model can be extracted from the BIM standard Industry Foundation Classes for all "systems" in which objects participate in the distribution of shared services within the structure. (e.g., water distribution, sewage removal, information distribution (IT), electrical distribution).

At 364, a number of spatial relationships between a number of objects are determined. The spatial relationships can be determined from an analysis of the 3D geometric model. For example, the 3D geometric model can comprise data that relates to the various spatial relationships (e.g., physical relationship, location, physical properties, etc.) between various objects within a building. The 3D geometric model that relates to the various spatial relationships can be used to determine how the various objects will interact with other objects and spaces within the building.

At 366, the spatial relationships for the number of objects are exported. As described herein, the spatial relationships for a number of objects can be determined utilizing the 3D geometric model and the BIM data. These spatial relationships can be exported in a variety of ways. For example, the spatial relationships for the number of objects can be exported to create a virtual 3D display visualization 101. The spatial relationships for the number of objects can also be exported and written to augment the existing BIM data. Augmenting the existing BIM data can include writing the spatial relationship data into the BIM data.

Exporting can include but is not limited to: sending of information to a different location, saving information to a different location, reformatting the information to a desired format, creating a virtual 3D display, saving the data to conform to a different standard (e.g., GBXML), or serializing to a form prescribed by the interface for another application (customizable), etc.

A virtual 3D display visualization 101 can be created based on the three dimensional geometric model. The virtual 3D display visualization can be created for all of the BIM data and/or the virtual 3D display visualization can be created for a filtered portion of the BIM data. The BIM data can be filtered using a relationship analysis user interface as described herein, among using other filtering techniques. Filtering the BIM data can create the virtual 3D display visualization for a number of objects with a spatial relationship and can include only desired objects (e.g., particular equipment, systems).

An object selection function (e.g., application interface for other systems, application interface for human users) can be provided for the virtual 3D display visualization of the building to allow selection of an object from a number of objects. The selected object can have the BIM data relating to the selected object exported. The BIM data can be exported in a variety of formats (two dimensional, three dimensional, BIM format, PDF, .zip, etc.). The various formats can allow the selected relationship data to be exported to various locations (e.g., different window within the virtual 3D display visualization, various software, various devices, etc.).

Figure 4:
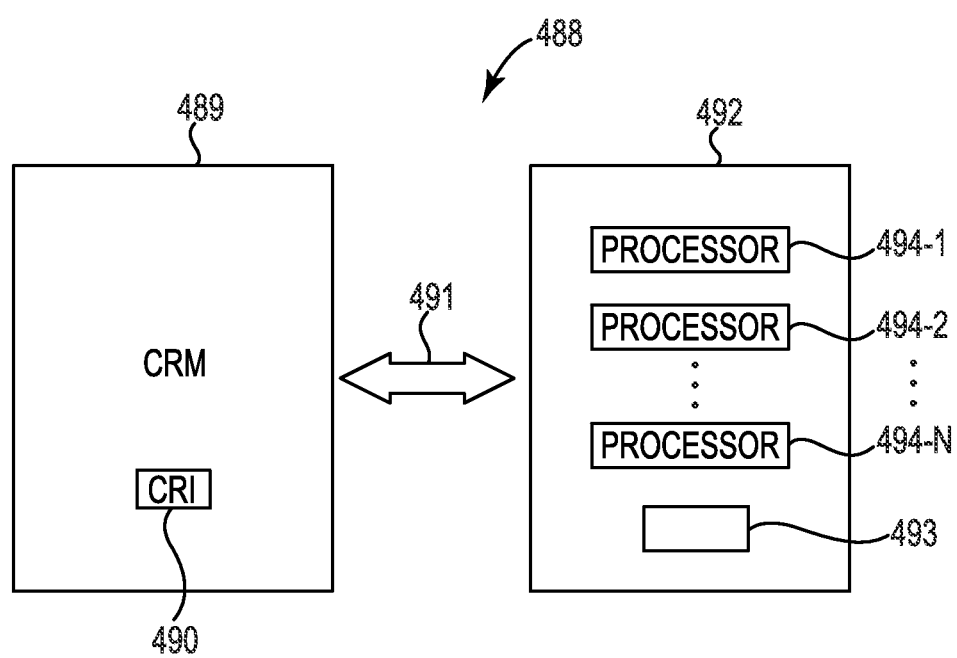
FIG. 4 illustrates a block diagram of an example of a computer-readable medium in communication with processing resources for implementing the extracting of relationship data from a 3D geometric model of a building in accordance with one or more embodiments of the present disclosure.

FIG. 4 illustrates a block diagram 488 of an example of a computer-readable medium (CRM) 489 in communication with processing resources 494-1, 494-2, . . . , 494-N for implementing the extracting of relationship data from a 3D geometric model of a building in accordance with one or more embodiments of the present disclosure.

The computing device, as described herein, can also include a CRM 489 in communication with processing resources 494-1, 494-2, . . . , 494-N. CRM 489 can be in communication with a device 492 (e.g., a Java® application server, among others) having processor resources 494-1, 494-2, . . . , 494-N. The device 492 can be in communication with a tangible non-transitory CRM 489 storing a set of computer-readable instructions (CRI) 490 executable by one or more of the processor resources 494-1, 494-2, . . . , 494-N, as described herein. The CRI 490 can also be stored in remote memory managed by a server and represent an installation package that can be downloaded, installed, and executed. The device 492 can include memory resources 793, and the processor resources 494-1, 494-2, . . . , 494-N can be coupled to the memory resources 493.

Processor resources 494-1, 494-2, . . . , 494-N can execute CRI 490 that can be stored on an internal or external non-transitory CRM 489. The processor resources 494-1, 494-2, . . . , 494-N can execute CRI 490 to perform various functions. For example, the processor resources 494-1, 494-2, . . . , 494-N can execute CRI 490 to extract relationship data from a 3D geometric model of BIM data. A non-transitory CRM (e.g., CRM 489), as used herein, can include volatile and/or non-volatile memory. Volatile memory can include memory that depends upon power to store information, such as various types of dynamic random access memory (DRAM), among others. Non-volatile memory can include memory that does not depend upon power to store information. Examples of non-volatile memory can include solid state media such as flash memory, electrically erasable programmable read-only memory (EEPROM), phase change random access memory (PCRAM), magnetic memory such as a hard disk, tape drives, floppy disk, and/or tape memory, optical discs, digital versatile discs (DVD), Blu-ray discs (BD), compact discs (CD), and/or a solid state drive (SSD), etc., as well as other types of computer-readable media.

The non-transitory CRM 489 can also include distributed storage media. For example, the CRM 489 can be distributed among various locations.

The non-transitory CRM 489 can be integral, or communicatively coupled, to a computing device, in a wired and/or a wireless manner. For example, the non-transitory CRM 489 can be an internal memory, a portable memory, a portable disk, or a memory associated with another computing resource (e.g., enabling CRIs to be transferred and/or executed across a network such as the Internet).

The CRM 489 can be in communication with the processor resources 494-1, 494-2, . . . , 494-N via a communication path 491. The communication path 491 can be local or remote to a machine (e.g., a computer) associated with the processor resources 494-1, 494-2, . . . , 494-N. Examples of a local communication path 491 can include an electronic bus internal to a machine (e.g., a computer) where the CRM 489 is one of volatile, non-volatile, fixed, and/or removable storage medium in communication with the processor resources 494-1, 494-2, . . . , 494-N via the electronic bus. Examples of such electronic buses can include Industry Standard Architecture (ISA), Peripheral Component Interconnect (PCI), Advanced Technology Attachment (ATA), Small Computer System Interface (SCSI), Universal Serial Bus (USB), among other types of electronic buses and variants thereof.

The communication path 491 can be such that the CRM 489 is remote from the processor resources e.g., 494-1, 494-2, ..., 494-N, such as in a network relationship between the CRM 489 and the processor resources (e.g., 494-1, 494-2, ..., 494-N). That is, the communication path 491 can be a network relationship. Examples of such a network relationship can include a local area network (LAN), wide area network (WAN), personal area network (PAN), and the Internet, among others. In such examples, the CRM 489 can be associated with a first computing device and the processor resources 494-1, 494-2, ..., 494-N can be associated with a second computing device (e.g., a Java® server, etc.). For example, a processing resource 494-1, 494-2, ..., 494-N can be in communication with a CRM 489, wherein the CRM 489 includes a set of instructions and wherein the processing resource 494-1, 494-2, ..., 494-N is designed to carry out the set of instructions for extracting relationship data from a 3D geometric model of BIM data.

The processor resources 494-1, 494-2, ..., 494-N coupled to the memory 490 can determine a spatial relationship between a number of filtered objects within BIM data. The processor resources 494-1, 494-2, ..., 494-N coupled to the memory 490 can create a 3D geometric model based on the spatial relationships. The processor resources 494-1, 494-2, ..., 494-N coupled to the memory 490 can also provide an object selection function for the number of objects. The processor resources 494-1, 494-2, ..., 494-N coupled to the memory 490 can also export relationship data for a selected object from the number of objects. The processor resources 494-1, 494-2, ..., 494-N coupled to the memory 490 can also enable a user modification of the relationship data. Furthermore, the processor resources 494-1, 494-2, ..., 494-N coupled to the memory 490 can write the spatial relationships into the BIM data based on user modification of the relationship data.

As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for extracting relationship data from building information model (BIM) data, comprising:
    generating a first three dimensional (3D) geometric model of a number of objects of a building within the BIM data;
    selecting an area within the first three dimensional geometric model of the building, wherein the area is a portion of the building comprising less than all of the building;
    selecting a relationship category for the selected area;
    defining a portion of objects from the number of objects positioned within the area that meet criteria of the selected relationship category for the selected area;
    displaying a path of the selected relationship category that includes a list of the portion of objects that are each assigned a different number, wherein the list of the portion of objects include a list of numbers that is organized to represent a connection between each object of the portion of objects;
    exporting BIM data corresponding to the defined objects positioned within the selected area of the first three dimensional geometric model that meet the criteria of the selected relationship category;
    generating a second three dimensional geometric model of the area comprising only the exported BIM data corresponding to the defined objects;
    updating a change to an object of the portion of objects to include a spatial relationship of the object into the BIM data, wherein updating the change is in response to an actual change of the object within the building;
    determining a number of spatial relationships between the changed object and the defined objects positioned within the area, wherein the spatial relationships are determined from the second three dimensional geometric model and the updated spatial relationship of the object in the BIM data;
    exporting the spatial relationships based on a number of criteria to a fault detection and diagnosis application to diagnose a problem with the object of the portion of objects of the building;
    receiving a notification that the object of the portion of objects has been changed by a user at a physical location of the building;
    alerting other users at the physical location of the building that the object has been changed;
    creating a virtual 3D display visualization of the number of objects based on the first three dimensional geometric model; and
    providing an object selection function for the virtual 3D display visualization of the building to allow selection of a subset of objects from the number of objects and exporting data of the subset of objects from data utilized to create the virtual 3D display visualization.

2. The method of claim 1, wherein creating the virtual 3D display visualization of the building includes designating a color to each of the number of objects based on a desired relationship.

3. The method of claim 1, wherein exporting data based on a number of criteria includes exporting data based on a touch relationship with a single object.

4. The method of claim 1, wherein exporting data based on a number of criteria includes exporting data based on a containment relationship with a single object.

5. The method of claim 1, wherein exporting data based on a number of criteria includes exporting data based on an overlap relationship with a single object.

6. The method of claim 1, wherein exporting data based on a number of criteria includes exporting data based on a disjoint relationship with a single object.

7. The method of claim 1, wherein the method includes categorizing the number of objects based on a set of criteria.

8. The method of claim 1, wherein the method includes exporting the data in various formats.

9. The method of claim 8, wherein the various formats include those for fault detection and diagnosis applications.

10. The method of claim 8 wherein the various formats include those described by other standards such as GBXML.

11. The method of claim 1, wherein the method includes managing export relationship data for desired data export upon subsequent selection of the object.

12. A system for extracting relationship data from building information model (BIM) data, the system comprising a processing resource in communication with a non-transitory computer readable medium, wherein the non-transitory computer readable medium includes a set of instructions and wherein the processing resource is designed to carry out the set of instructions to:
determine a spatial relationship between a number of filtered objects within the BIM data;
generate a first three dimensional geometric model of a building based on the spatial relationship;
select an area within the first three dimensional geometric model, wherein the area is a portion of the building comprising less than all of the building;
select a relationship category for the selected area;
define a portion of objects from the number of objects positioned within the area that meet criteria of the selected relationship category for the selected area;
display a path of the selected relationship category that includes a list of the portion of objects that are each assigned a different number, wherein the list of the portion of objects include a list of numbers that is organized to represent a connection between each object of the portion of objects;
export BIM data corresponding to the defined objects positioned within the selected area of the first three dimensional geometric model that meet the criteria of the selected relationship category;
generate a second three dimensional geometric model that includes only the exported BIM data corresponding to the defined objects positioned within the area from the number of filtered objects;
update a change to an object of the portion of objects to include a spatial relationship of the object into the BIM data, wherein updating the change is in response to an actual change of the object within the building;
export the spatial relationship data for the defined objects based on the relationship category to a fault detection and diagnosis application to diagnose a problem with the object of the portion of objects of the building;
receive a notification that the object of the portion of objects has been changed by a user at the physical location of the building;
alert other users at a physical location of the building that the object has been changed;
creating, on a display of a device, a virtual 3D display visualization of the number of objects based on the first three dimensional geometric model; and
provide, on the display of the device, an object selection function for the virtual 3D display visualization of the building to allow selection of a subset of objects from the number of objects and exporting data of the subset of objects from data utilized to create the virtual 3D display visualization.

13. The system of claim 12, wherein the spatial relationship includes physical relationships between the number of objects.

14. The system of claim 12, wherein relationship data includes physical properties of the number of objects.

15. The system of claim 12, wherein the filtered objects comprise a system.

16. The system of claim 12, wherein the selected portion of objects is a system comprising multiple objects.

17. The system of claim 12, wherein the processing unit is designed to further carry out the set of instructions to write the spatial relationships into the BIM data based on user modification of the relationship data.

* * * * *